(12) United States Patent
Yamanaka

(10) Patent No.: US 7,872,868 B2
(45) Date of Patent: Jan. 18, 2011

(54) MOUNTING STRUCTURE FOR POWER MODULE, AND MOTOR CONTROLLER INCLUDING THE SAME

(75) Inventor: Yasunori Yamanaka, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 46 days.

(21) Appl. No.: 12/443,770

(22) PCT Filed: Sep. 28, 2007

(86) PCT No.: PCT/JP2007/068917

§ 371 (c)(1),
(2), (4) Date: Mar. 31, 2009

(87) PCT Pub. No.: WO2008/044485

PCT Pub. Date: Apr. 17, 2008

(65) Prior Publication Data

US 2010/0091461 A1   Apr. 15, 2010

(30) Foreign Application Priority Data

Oct. 6, 2006   (JP) .............................. 2006-275334

(51) Int. Cl.
*H05K 7/20* (2006.01)

(52) U.S. Cl. .................. 361/709; 361/679.53; 361/704; 361/710; 361/719; 363/141; 363/142

(58) Field of Classification Search ............ 361/679.46, 361/679.54, 688, 689, 704, 709, 710, 715, 361/717, 718, 719, 720, 728, 736, 748; 174/15.1, 174/16.3, 252; 165/80.3, 104.33, 104.34, 165/80.2, 185; 363/140, 141; 257/219, 698, 257/706, 707, 712, 717, 718, 719

See application file for complete search history.

(56) References Cited

U.S. PATENT DOCUMENTS 5,646,826 A  *  7/1997  Katchmar ................... 361/704

(Continued)

FOREIGN PATENT DOCUMENTS

| JP | 4-76094 U | 7/1992 |
|----|-----------|--------|
| JP | 10-173112 A | 6/1998 |
| JP | 11-274711 A | 10/1999 |
| JP | 411340389 A | * 12/1999 |
| JP | 2005-520260 A | 7/2005 |
| JP | 2006-156647 A | 6/2006 |
| WO | 03/088022 A1 | 10/2003 |

OTHER PUBLICATIONS

International Search Report of PCT/JP2007/068917, date of mailing Dec. 11, 2007.

*Primary Examiner*—Michael V Datskovskiy
(74) *Attorney, Agent, or Firm*—Westerman, Hattori, Daniels & Adrian, LLP

(57) ABSTRACT

A mounting structure for a power module, in which a power module and a heat sink can be easily separated without additional labor and time and without requiring an extra disassembly space in a product and in which parts are not damaged during the disassembly. In the heat sink (5a), screw holes (7a) having female screw threads into which power module fixing screws (2a) are screwed are formed so as to penetrate a power module mounting surface (5c) of the heat sink (5a) and heat radiation fins (9a). The power module fixing screw (2a) is constructed such that, to mount the power module (3) on the heat sink (5a), the screw head of the power module fixing screw (2a) is tightened from the printed circuit board (4a) side with a tool (8a) and that, to remove the power module (3) from the heat sink (5a), the power module fixing screw (2a) is loosened with the tool (8a) from the heat radiation fin (9a) side on the opposite side of the screw head.

5 Claims, 4 Drawing Sheets

U.S. PATENT DOCUMENTS

| | | | |
|---|---|---|---|
| 6,320,776 B1 * | 11/2001 | Kajiura et al. | 363/141 |
| 6,417,532 B2 * | 7/2002 | Tsunoda et al. | 257/219 |
| 6,424,026 B1 * | 7/2002 | Mangtani | 257/675 |
| 6,643,135 B2 * | 11/2003 | Tomioka | 361/719 |
| 6,714,414 B1 * | 3/2004 | Dubovsky et al. | 361/704 |
| 7,708,584 B2 * | 5/2010 | Hierholzer et al. | 439/487 |
| 2003/0189815 A1 | 10/2003 | Lee | |
| 2008/0037223 A1 * | 2/2008 | Muller et al. | 361/710 |

* cited by examiner (a)

MOUNTING STRUCTURE FOR POWER MODULE, AND MOTOR CONTROLLER INCLUDING THE SAME

TECHNICAL FIELD

The present invention relates to a power module used in the field of power electronics, mainly a motor controller such as an inverter or a servo amplifier operated with high-voltage electric power, the power module including a power semiconductor device that is an exothermic component. In particular, the present invention relates to a mounting structure for fixing the power module to a heat sink including a plurality of heat radiation fins for cooling the power module, and to a motor controller including the mounting structure.

BACKGROUND ART

Patent Document 1, for example, has proposed a mounting structure for a power module used in the field of power electronics, mainly a motor controller such as an inverter or a servo amplifier operated with high-voltage electric power, the power module including a power semiconductor device that is an exothermic component.

FIG. 2 is a sectional side view showing the existing mounting structure for a power module, FIG. 3 is a sectional side view showing the mounting structure for a power module in FIG. 2 in a state in which screw removal holes for removing the power module are provided to the mounting structure, and FIG. 4 is a sectional side view showing the mounting structure for a power module in FIG. 2 before being assembled.

FIGS. 2, 3, and 4 show printed circuit board fixing screws 1, power module fixing screws 2b, a power module 3, printed circuit boards 4a and 4b, a heat sink 5b, a power module mounting surface 5c, soldered portions 6, screw removal holes 7b, a tool 8b, and heat radiation fins 9b.

As shown in FIG. 2, after the power module 3 has been fixed to the heat sink 5b with the power module fixing screws 2b, the printed circuit board 4a is connected to the power module 3 by solder at the soldered portions 6. With this mounting structure, in order to separate the power module 3 and the heat sink 5b from each other after the printed circuit board 4a has been connected to the power module 3 by soldering, the solder connecting the power module 3 and the printed circuit board 4a is melted and removed; or, as shown in FIG. 3, the screw removal holes 7b are formed in the printed circuit board 4b, the tool 8b is inserted into the screw removal holes 7b, and the power module fixing screws 2b are removed with the tool 8b.

Patent Document 1: Japanese Unexamined Patent Application Publication No. 11-274711 (Description pp. 2-3, FIG. 1)

DISCLOSURE OF THE INVENTION

Problems to be Solved by the Invention

The existing mounting structure for a power module is constructed by, starting from a disassembled state shown in FIG. 4, fixing the power module 3 to the heat sink 5b with the power module fixing screws 2b as shown in FIG. 2, and then connecting the printed circuit board 4a to the power module 3 by soldering. Therefore, the existing mounting structure for a power module has a problem in that additional labor and time are necessary because the power module 3 and the heat sink 5b can be separated from each other only by melting and removing the solder with a desoldering tool.

Moreover, in order to melt and remove the solder, heat stress is applied to the printed circuit board 4a and the power module 3 by an amount considerably larger than the amount of heat stress applied for soldering. Therefore, the existing structure has another problem in that the printed circuit board 4a and the power module 3 are damaged by the excessive heat stress and cannot be reused.

Alternatively, in order to separate the power module 3 and the heat sink 5b from each other while maintaining a connection between the power module 3 and the printed circuit board 4a, a method of forming screw removal holes 7b in the printed circuit board 4b as shown in FIG. 3 has been used. However, when the screw removal holes 7b are formed, a space for disposing pattern wiring and parts on the printed circuit board is reduced, which causes a problem in that miniaturization is hindered.

The present invention, which has been achieved so as to overcome the problems, aims to provide a mounting structure for a power module and a motor controller including the mounting structure, with which a power module and a heat sink can be easily separated from an assembled state without additional labor and time, without requiring an extra disassembly space in a product, and without damaging parts during the disassembly.

Means for Solving the Problems

In order to solve the problem, the present invention is configured as follows.

The invention according to claim 1 is a mounting structure for a power module comprising a power module including a power semiconductor device that is an exothermic body; a heat sink to which a lower surface of the power module is fixed with a power module fixing screw, the heat sink including a plurality of heat radiation fins; and a printed circuit board to which a portion of the power module on the side of the power module opposite to that on the heat sink is connected by soldering, wherein, in the heat sink, a screw hole having a female screw thread into which the power module fixing screw is screwed is formed so as to penetrate the heat sink from a power module mounting surface to the plurality of heat radiation fins, and The invention according to claim 2 is the mounting structure for a power module according to claim 1; wherein the power module fixing screw is constructed such that, to mount the power module on the heat sink, a screw head of the power module fixing screw is tightened from the printed circuit board side and that, to remove the power module from the heat sink, the power module fixing screw is loosened from the heat radiation fin side on the side of the power module fixing screw opposite to the screw head.

The invention according to claim 2 is the mounting structure for a power module according to claim 1, wherein the power module fixing screw has a screwdriver slot formed in an end portion thereof on the side of the fixing screw opposite to the screw head.

The invention according to claim 3 is the mounting structure for a power module according to claim 1, wherein the power module fixing screw has a wrench socket formed in an end portion thereof on the side of the fixing screw opposite to the screw head.

The invention according to claim 4 is the mounting structure for a power module according to claim 1, wherein, in a position of the power module facing the screw hole of the heat sink, a hole for inserting the power module fixing screw is formed in a mounting eye that is recessed by a certain distance from an upper surface of the power module.

The invention according to claim 5 is a motor controller comprising the mounting structure for a power module according to claim 1.

ADVANTAGES

With the mounting structure for a power module according to claim 1, in order to disassemble the structure from a state in which the power module has been connected to the printed circuit board by soldering and the power module, the printed circuit board, and the heat sink have been assembled, the power module and the heat sink can be easily separated from each other by loosening the power module fixing screws with a tool from the heat radiation fin side of the heat sink, without forming screw removal holes in positions in the printed circuit board in which the power module fixing screws are disposed as in the existing technique.

Moreover, the power module and the heat sink can be easily separated from each other without additional labor and time, without requiring an extra disassembly space in a product, and without damaging parts during the disassembly.

With the mounting structure for a power module according to in claims 2 and 3, by forming the screwdriver slot or the wrench socket on the end portion of the power module fixing screw on the side of the fixing screw opposite to the screw head, the printed circuit board and the power module can be easily separated from the heat sink with a tool such as a screwdriver or a wrench after having been assembled.

Because the power module and the heat sink are separated from each other after having been assembled, the parts are not damaged and can be reassembled.

With the mounting structure for a power module according to claim 4, by forming the hole for inserting the power module fixing screw in the recessed mounting eye of the power module in the position of the power module facing the screw holes of the heat sink, the screw head of the power module fixing screw is prevented from contacting a protrusion or the like on the printed circuit board.

With the motor controller according to claim 5, by applying the mounting structure for a power module according to claim 1 to the motor controller, the advantage according to claim 1 can be easily gained, and, for example, assembling and disassembling can be easily performed when a power module is installed in a device such as an inverter.

Figure 1:
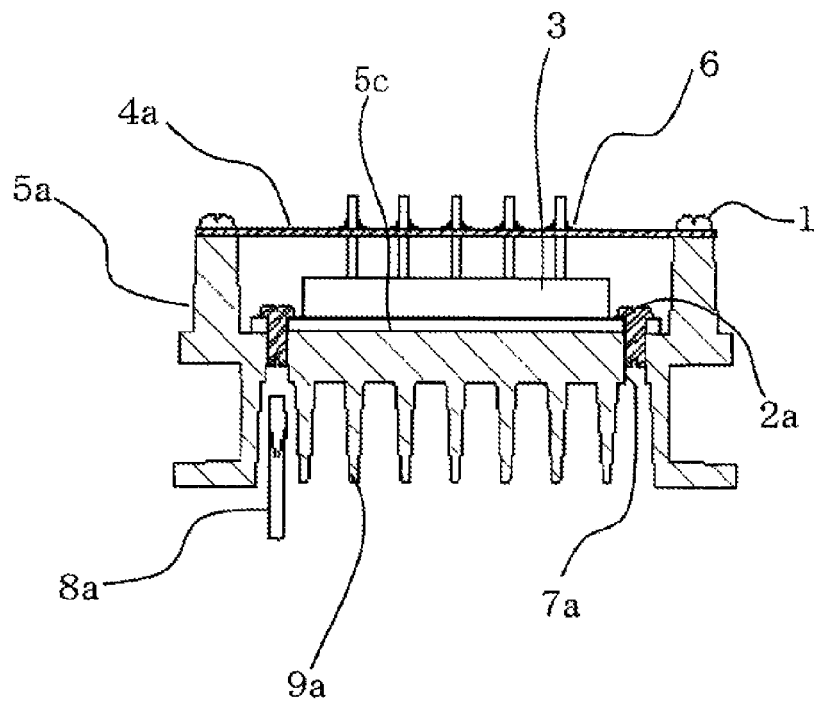
FIG. 1 is a sectional side view of a mounting structure for a power module showing an embodiment of the present invention.
Figure 2:
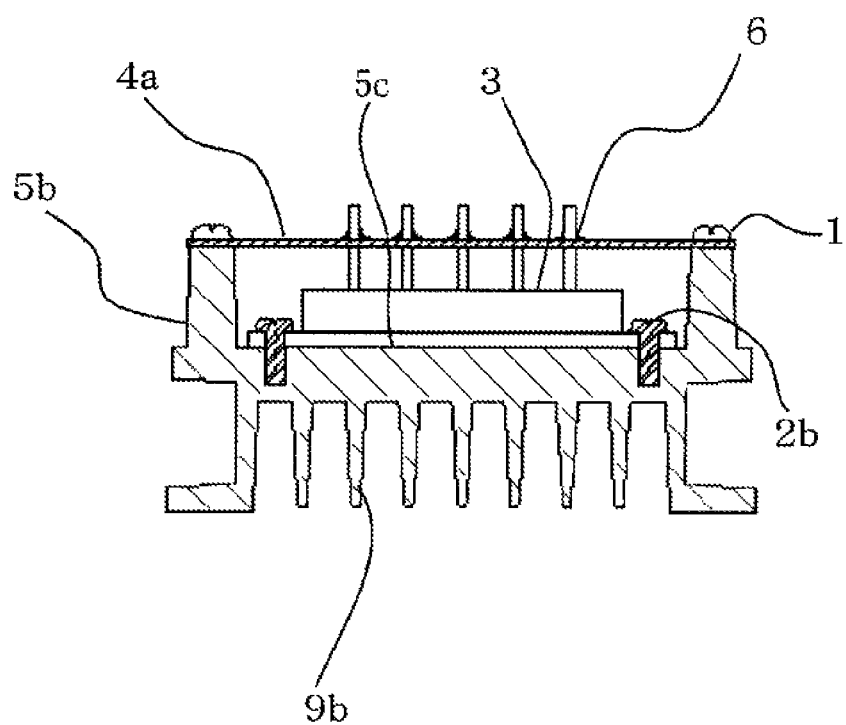
FIG. 2 is a sectional side view showing an existing mounting structure for a power module.
Figure 3:
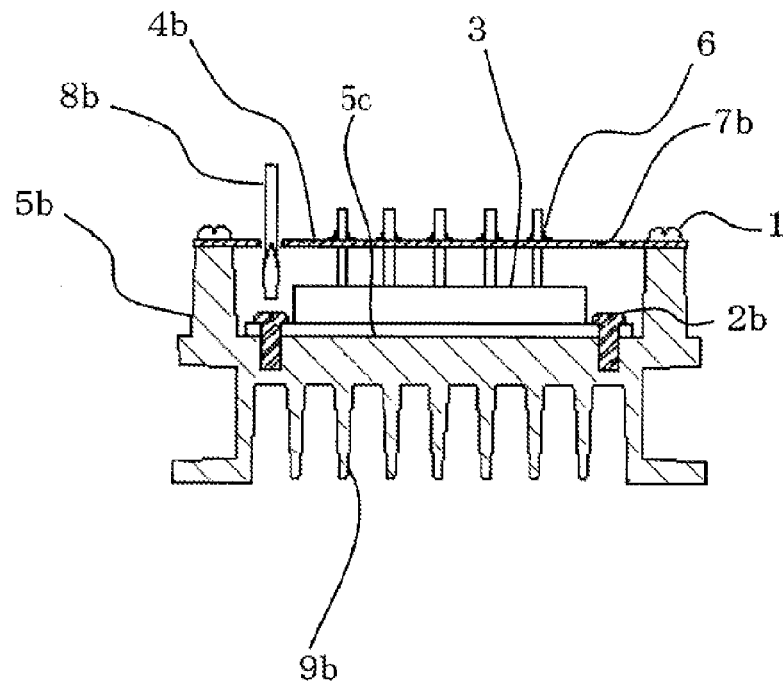
FIG. 3 is a sectional side view showing the mounting structure for a power module in FIG. 2 in a state in which screw removal holes for removing the power module are provided to the mounting structure.
Figure 4:
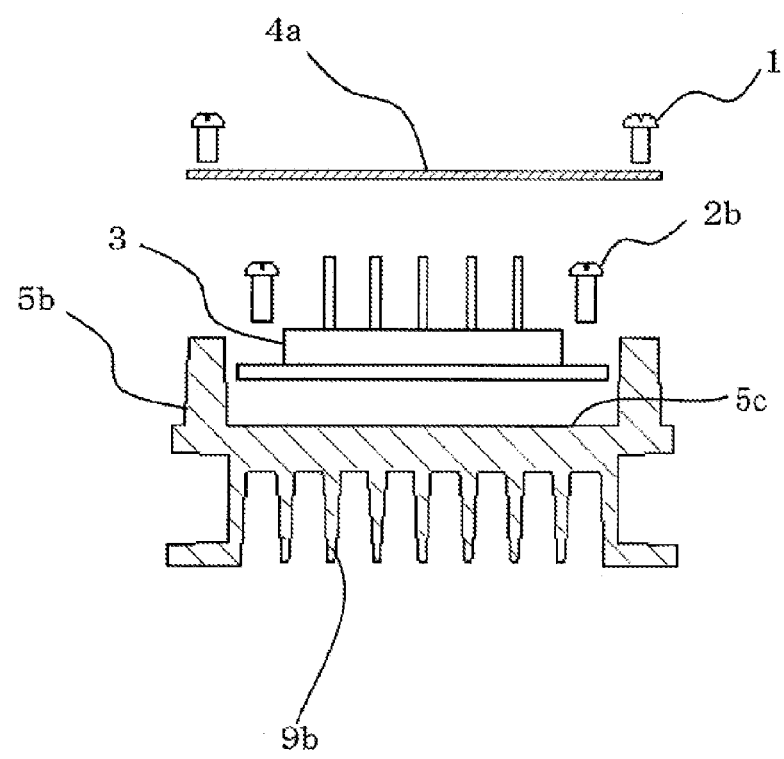
FIG. 4 is a sectional side view showing the mounting structure for a power module in FIG. 2 before being assembled.

REFERENCE NUMERALS 1 printed circuit board fixing screw
2a, 2b power module fixing screw
3 power module
3a mounting eye
3b hole
4a, 4b printed circuit board
5a, 5b heat sink
5c power module mounting surface
6 soldered portion
7a screw hole
7b screw removal hole
8a, 8b tool
9a, 9b heat radiation fin
S slot
H hexagonal socket

BEST MODE FOR CARRYING OUT THE INVENTION

Hereinafter, an embodiment of the present invention is described with reference to the drawings.

First Embodiment

Figure 5:
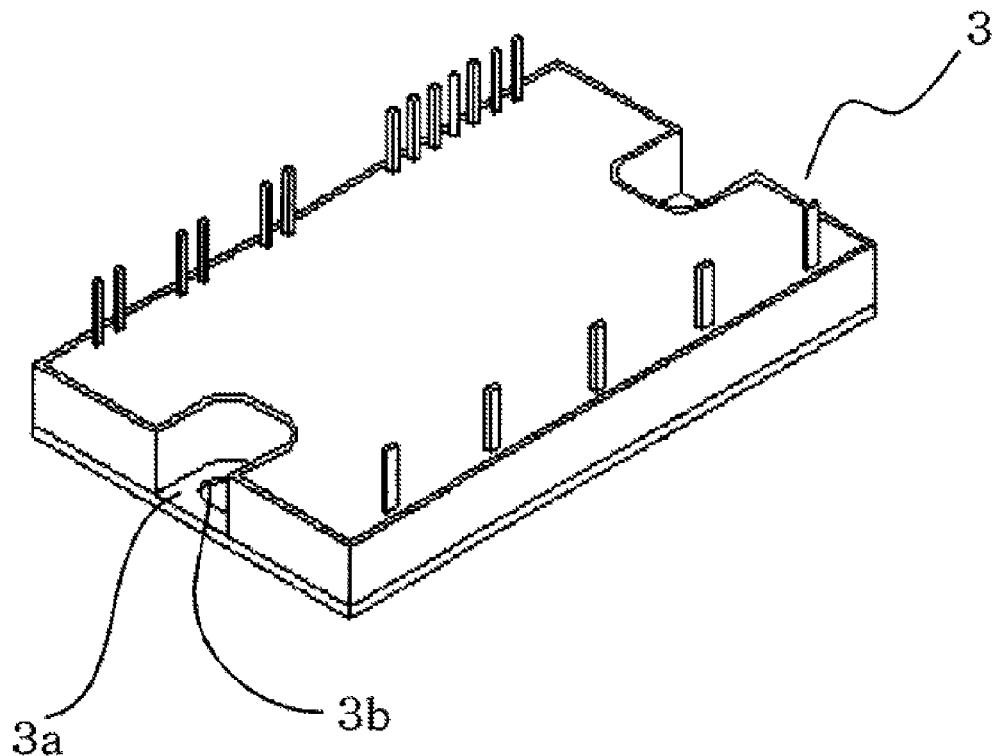
FIG. 5 is a general perspective view of a power module in the embodiment.
Figure 6:
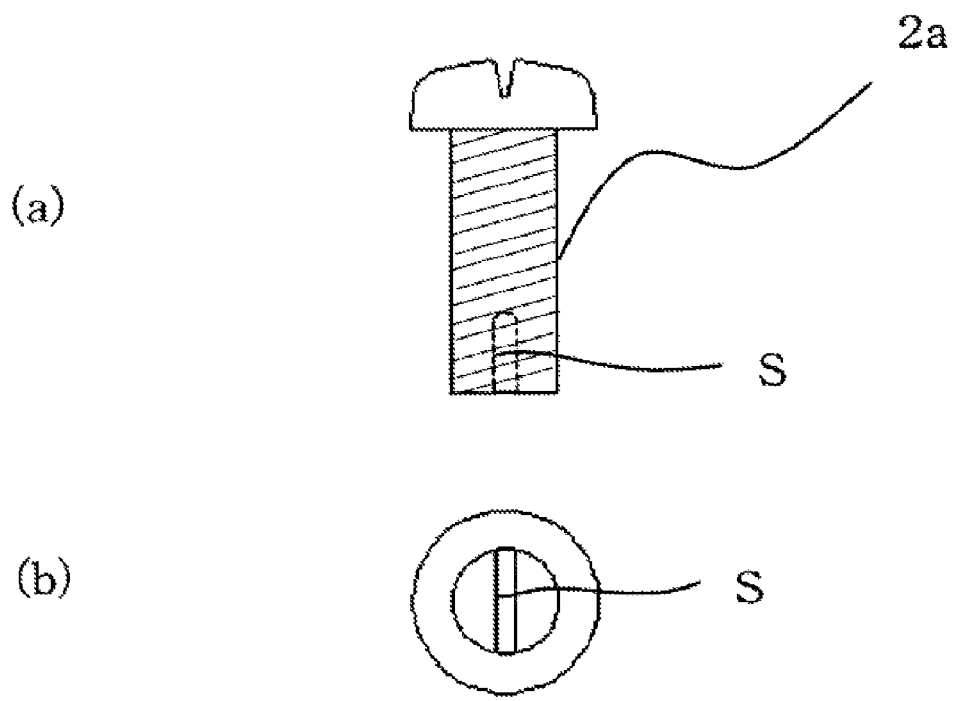
FIG. 6 is an external view of a power module fixing screw in the embodiment, in which (a) is a front view and (b) is a bottom view (screwdriver slot).
Figure 7:
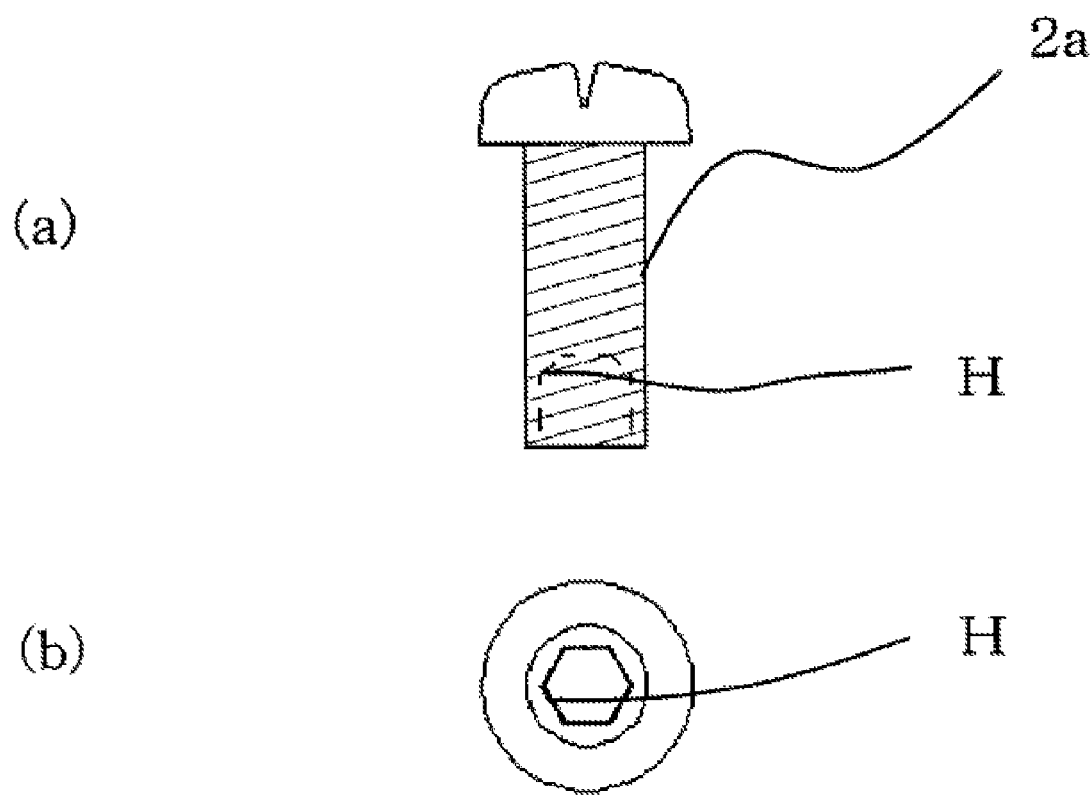
FIG. 7 is an external view of a power module fixing screw in the embodiment, in which (a) is a front view and (b) is a bottom view (wrench socket).

FIG. 1 is a sectional side view of a mounting structure for a power module showing an embodiment of the present invention; FIG. 5 is a general perspective view of the power module; FIG. 6 is an external view showing a power module fixing screw of the embodiment, in which (a) is a front view and (b) is a bottom view (screwdriver slot); and FIG. 7 is an external view showing a power module fixing screw of the embodiment, in which (a) is a front view and (b) is a bottom view (wrench socket).

FIGS. 1 and 5 show printed circuit board fixing screws 1, power module fixing screws 2a, mounting eyes 3a, holes 3b, a printed circuit board 4a, a heat sink 5a, a power module mounting surface 5c, soldered portions 6, screw holes 7a, a tool 8a, and heat radiation fins 9a.

The present invention is different from the existing technique in that, in the heat sink 5a, the screw holes 7a having female screw threads (taps), into which the power module fixing screws 2a for fixing the power module 3 are screwed, are formed so as to penetrate the heat sink 5a from the power module mounting surface 5c to the heat radiation fins 9a.

The power module fixing screw 2a is constructed such that, to mount the power module 3 on the heat sink 5a, the screw head of the power module fixing screw 2a is tightened from the printed circuit board 4a side to the hole 3b of the power module 3 and the heat sink 5a with the tool 8a and that, to remove the power module 3 from the heat sink 5a, the power module fixing screw 2a is loosened with the tool 8a from the heat radiation fin 9a side on the side of the power module fixing screw 2a opposite to the screw head to the power module 3 side.

The power module fixing screw 2a shown in FIG. 6 is constructed such that a slot S for a screwdriver is formed on an end of the fixing screw on the side opposite to the screw head. The power module fixing screw shown in FIG. 6 may be substituted by a power module fixing screw shown in FIG. 7 constructed such that a hexagonal socket H for a wrench is formed. As shown in FIG. 1, the structure allows the power module fixing screw to be easily loosened with the tool 8a from the heat radiation fin 9a side.

As shown in FIG. 5, in positions of the heat sink of the power module 3 facing the screw holes 7a shown in FIG. 1, the holes 3b for inserting the power module fixing screws thereinto are formed in the mounting eyes 3a, which are recessed by a certain distance from the upper surface of the power module 3.

Referring to FIGS. 1 and 5, an assembly process is described.

First, the power module 3 is disposed on the heat sink 5a, the power module fixing screws 2a are inserted into the holes 3b in the mounting eyes 3a of the power module 3 from the side of the printed circuit board 4a, and the power module fixing screws 2a are screwed into the screw holes 7a in the heat sink 5a having female screw threads, so that the power module 3 and the heat sink 5a are fastened together.

Next, the printed circuit board 4a is attached to the heat sink 5a and the power module 3. The printed circuit board 4a and the heat sink 5a are fixed to the heat sink 5a with the printed circuit board fixing screws 1 as necessary, and the printed circuit board 4a and the power module 3 are connected with each other by soldering.

Thus, the printed circuit board, the power module, and the heat sink are integrally fixed. When it becomes necessary to separate the power module from the heat sink later, the power module fixing screws 2a can be loosened from the heat radiation fin 9a side on the side opposite to the screw heads, because the screw holes 7a are formed in the heat sink 5a so as to penetrate the heat sink 5a from the power module mounting surface 5c to the heat radiation fins 9a.

Because the first embodiment of the present invention has the above-described structure, when it becomes necessary to separate the power module from the heat sink after the printed circuit board, the power module, and the heat sink have been integrally fixed, it is not necessary to separate the printed circuit board and the power module from each other by melting and removing solder from the soldered portions at which the printed circuit board and the power module are connected by solder, nor is it necessary to form screw removal holes in the printed circuit board at positions facing the heads of the power module fixing screws. As shown in FIG. 1, even after the power module and the heat sink have been assembled, the power module and the heat sink can be easily separated from each other by inserting a tool into the screw hole from the heat radiation fin side and loosening the power module fixing screw.

INDUSTRIAL APPLICABILITY

With the mounting structure for a power module and the motor controller including the mounting structure of the present invention, when disassembling the power module from an assembled state, a power module and a heat sink can be easily separated from each other without additional labor and time, without requiring an extra disassembly space in a product, and without damaging parts during the disassembly. Therefore, the present invention is applicable to the field of power electronics including mainly a power conversion device operated with high-voltage electric power, such as an inverter for converting direct current to alternating current and a converter for converting alternating current to direct current, and a motor controller for driving a motor typified by a servo amplifier.

The invention claimed is:

1. A mounting structure for a power module, comprising:
   a power module including a power semiconductor device that is an exothermic body;
   a heat sink to which a lower surface of the power module is fixed with a power module fixing screw, the heat sink including a plurality of heat radiation fins; and
   a printed circuit board to which a portion of the power module on the side of the power module opposite to that on the heat sink is connected by soldering,
   wherein, in the heat sink, a screw hole having a female screw thread into which the power module fixing screw is screwed is formed so as to penetrate the heat sink from a power module mounting surface to the plurality of heat radiation fins, and
   wherein the power module fixing screw is constructed such that, to mount the power module on the heat sink, a screw head of the power module fixing screw is tightened from the printed circuit board side and that, to remove the power module from the heat sink, the power module fixing screw is loosened from the heat radiation fin side on the side of the power module fixing screw opposite to the screw head.

2. The mounting structure for a power module according to claim 1, wherein a screwdriver slot is formed in an end portion of the power module fixing screw on the side of the fixing screw opposite to the screw head.

3. The mounting structure for a power module according to claim 1, wherein a wrench socket is formed in an end portion of the power module fixing screw on the side of the fixing screw opposite to the screw head.

4. The mounting structure for a power module according to claim 1, wherein, in a position of the power module facing the screw hole of the heat sink, a hole for inserting the power module fixing screw is formed in a mounting eye that is recessed by a certain distance from an upper surface of the power module.

5. A motor controller comprising the mounting structure for a power module according to claim 1.

* * * * *